United States Patent [19]
Tilley et al.

[11] Patent Number: 6,157,260
[45] Date of Patent: *Dec. 5, 2000

[54] METHOD AND APPARATUS FOR CALIBRATING A LOCAL OSCILLATOR IN A DIRECT CONVERSION RECEIVER

[75] Inventors: Keith A. Tilley, Sunrise, Fla.; Rajesh H. Zele, Austin, Tex.; Walter H. Kehler, Jr., Sunrise, Fla.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 09/260,306

[22] Filed: Mar. 2, 1999

[51] Int. Cl.$^7$ ........................................................ H03L 7/00
[52] U.S. Cl. ................................. 331/2; 331/14; 455/260; 455/265
[58] Field of Search .......................... 331/14, 2; 455/255, 455/257, 258, 260, 265, 180.3, 182.1, 182.2

[56] References Cited

U.S. PATENT DOCUMENTS

| | | |
|---|---|---|
| 4,242,649 | 12/1980 | Washburn, Jr. .......................... 455/260 |
| 4,313,209 | 1/1982 | Drucker . |
| 4,742,566 | 5/1988 | Nordholt et al. ........................ 455/260 |
| 4,743,867 | 5/1988 | Smith . |
| 4,837,853 | 6/1989 | Heck ........................................ 455/208 |
| 4,955,075 | 9/1990 | Anderson .............................. 455/182.2 |
| 5,079,526 | 1/1992 | Heck ........................................ 332/127 |
| 5,402,446 | 3/1995 | Minami ................................... 455/260 |
| 5,412,353 | 5/1995 | Chaplik et al. ............................ 331/23 |
| 5,584,062 | 12/1996 | Meador et al. .......................... 455/260 |

*Primary Examiner*—Robert Pascal
*Assistant Examiner*—Kimberly E Glenn
*Attorney, Agent, or Firm*—Barbara R. Doutre

[57] ABSTRACT

A receiver includes a main loop (222) having a main VCO (210) and a secondary loop (224) having a secondary VCO (216). The receiver momentarily phase locks an incoming RF signal (228), and then samples and stores a correction voltage (240) being applied to the main VCO (210). The main loop (222) is then put into a non-phase locked mode of operation and the stored correction voltage is applied through a receive automatic tuning circuit (218) to the main VCO (210) for the duration of the incoming RF signal (228). This effectively calibrates the LO frequency (230) of the receiver to the incoming RF signal frequency (228).

6 Claims, 2 Drawing Sheets

METHOD AND APPARATUS FOR CALIBRATING A LOCAL OSCILLATOR IN A DIRECT CONVERSION RECEIVER

TECHNICAL FIELD

This invention relates to receiver circuits and more specifically to tuning methods for PLL circuits.

BACKGROUND

Many of today's direct conversion receivers operate in a continuous phase locked mode. Most of these direct conversion receivers have multiple control loops that are active when receiving a message. FIG. 1 is a block diagram of a prior art phase lock loop (PLL) 100 such as would be found in a receiver of a radio, cell phone, or other communication device. PLL 100 is formed of two control loops, a main loop 102 and a secondary loop 104. The interaction between the control loops tends to create a complex environment in which multiple operations, such as DC correction, automatic gain control, and phase locking are all taking place.

In operation, PLL 100 receives a radio frequency (RF) input signal 106 and mixes this signal with a local oscillator (LO) signal 108 at mixer 110 to produce an intermediate frequency (IF) signal 112. The IF signal 112 is filtered through a baseband filter and mixed with a first reference frequency signal ($F_{REF1}$) 117 at up mixer 116 to generate an upconverted signal 124. The upconverted signal 124 then splits off into two paths, a high port path in which the signal 124 is demodulated through a demodulator 118, and a low port path which uses a phase detector 120 and equalization circuit 130 to extract low frequency modulation from the signal 124. During operation in phase locked mode the main loop 102 tracks out low frequency components of the modulation, and it is therefore necessary to extract these low frequency components from the phase detector output 128 and equalize the two modulation paths through the equalization circuit 130 and summer 132 port to produce a demodulated signal 134.

The phase detector 120 compares a second reference frequency ($F_{REF2}$) 122 to the upconverted signal 124 to produce an output signal having sufficient current to drive a main loop VCO 126. Ideally, the phase detector output 128 would feed the main VCO 126 directly, but one of the problems with this prior art PLL is that the main VCO tends to drift off frequency thereby preventing the secondary loop 104 from locking. To compensate for the drift, a reference frequency automatic tuning circuit 136 is used to periodically center the frequency of the main VCO 126. The reference frequency automatic tuning circuit 136 provides an offset current to correct for the offset of the frequency of the main VCO 126.

The reference frequency automatic tuning circuit 136 used in PLL 100 tunes the main VCO 126 to a precise predetermined frequency. Reference frequency automatic tuning circuit 136 operates by tuning the main VCO 126 to that predetermined frequency and then storing the resulting correction voltage digitally. When the main VCO 126 is placed back in the main phase locked loop the stored correction voltage is applied to the main VCO, guaranteeing the receiver is tuned on frequency and the make tolerance of the VCO has been compensated. In short, the prior art concept is that the newly reconfigured loop uses another reference and centers the VCO about that reference.

Within secondary loop 104, the main VCO output is mixed with the first LO 108 at mixer 138 to produce a second intermediate frequency (IF) signal 139. The IF signal 139 drives another phase detector 140 which controls a secondary VCO 142. The secondary loop 104 determines the first LO injection frequency 108. The combination of the main loop and secondary loop keeps the receiver phase locked to the incoming RF signal.

Phase locking the receiver 100 to the input signal 106 causes the modulation to be tracked out requiring the use of the equalization circuit 130 and summer 132. Operating in phase locked mode also produces poor group delay characteristics which can be troublesome certain types of data reception. The presence of strong adjacent channel signals can also cause the main loop to attempt to lock on the adjacent channel. This can result in the loop becoming indecisive and switching between the desired signal and the adjacent channel to the point that the desired signal becomes effectively lost in the resulting noise. It would therefore be beneficial to simplify the system and eliminate the need for the equalization portion of the circuit.

Accordingly, there is a need for an improved receiver circuit with reduced complexity, while maintaining reliable calibrated tuning conditions.

DETAILED DESCRIPTION OF THE PREFERRED EMBODIMENT

Figure 1:
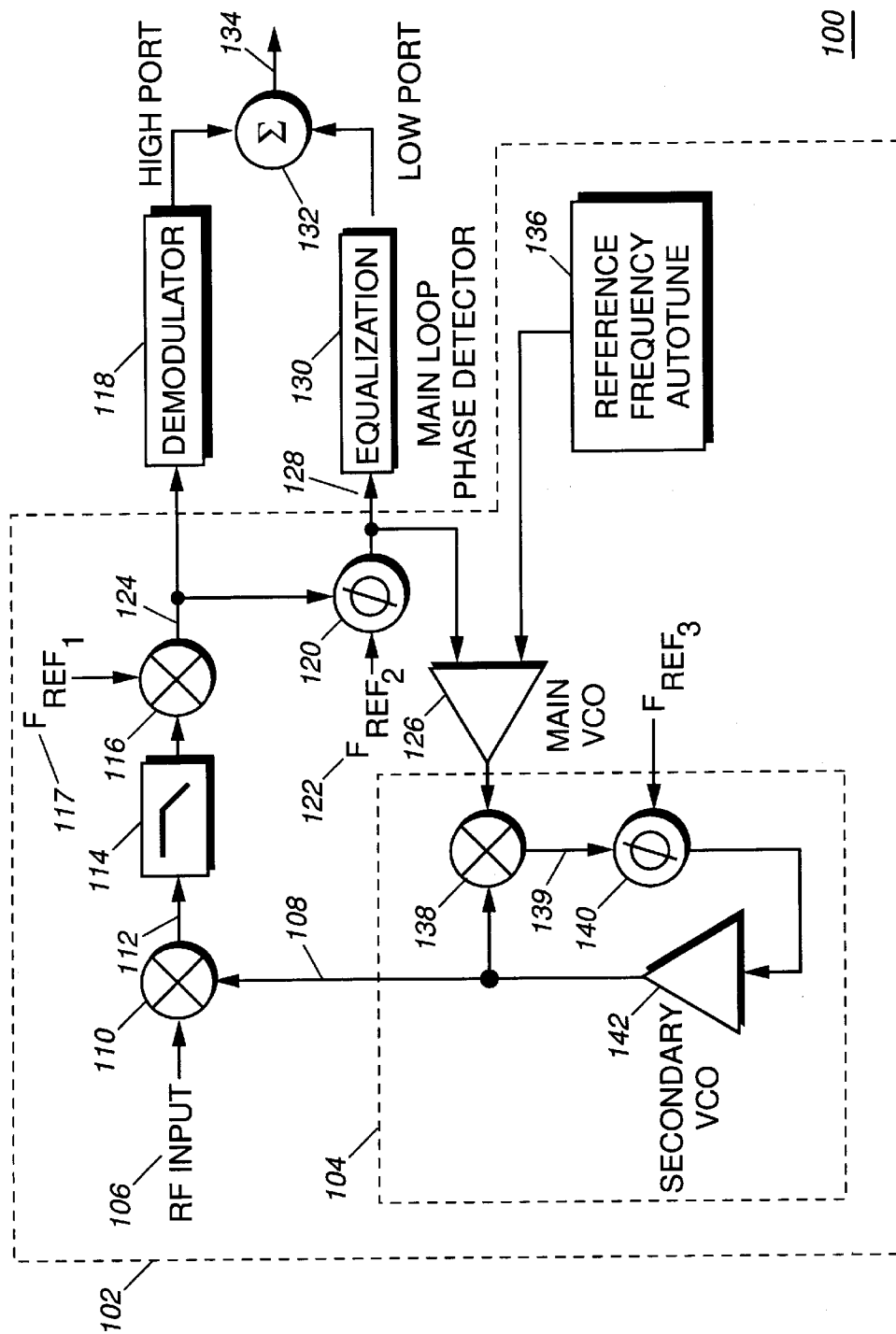
FIG. 1 is a block diagram of a prior art phase lock loop circuit.

While the specification concludes with claims defining the features of the invention that are regarded as novel, it is believed that the invention will be better understood from a consideration of the following description in conjunction with the drawing figures.

In accordance with the present invention, the receiver to be described herein is based on a concept of momentarily phase locking the incoming RF signal and sampling and storing the correction voltage that the main loop is applying to the main VCO. The main loop is then placed in a non-phase locked mode of operation and the stored correction voltage is applied to the main VCO for the duration of an incoming message. This effectively calibrates the LO frequency of the receiver to the incoming RF signal frequency.

Figure 2:
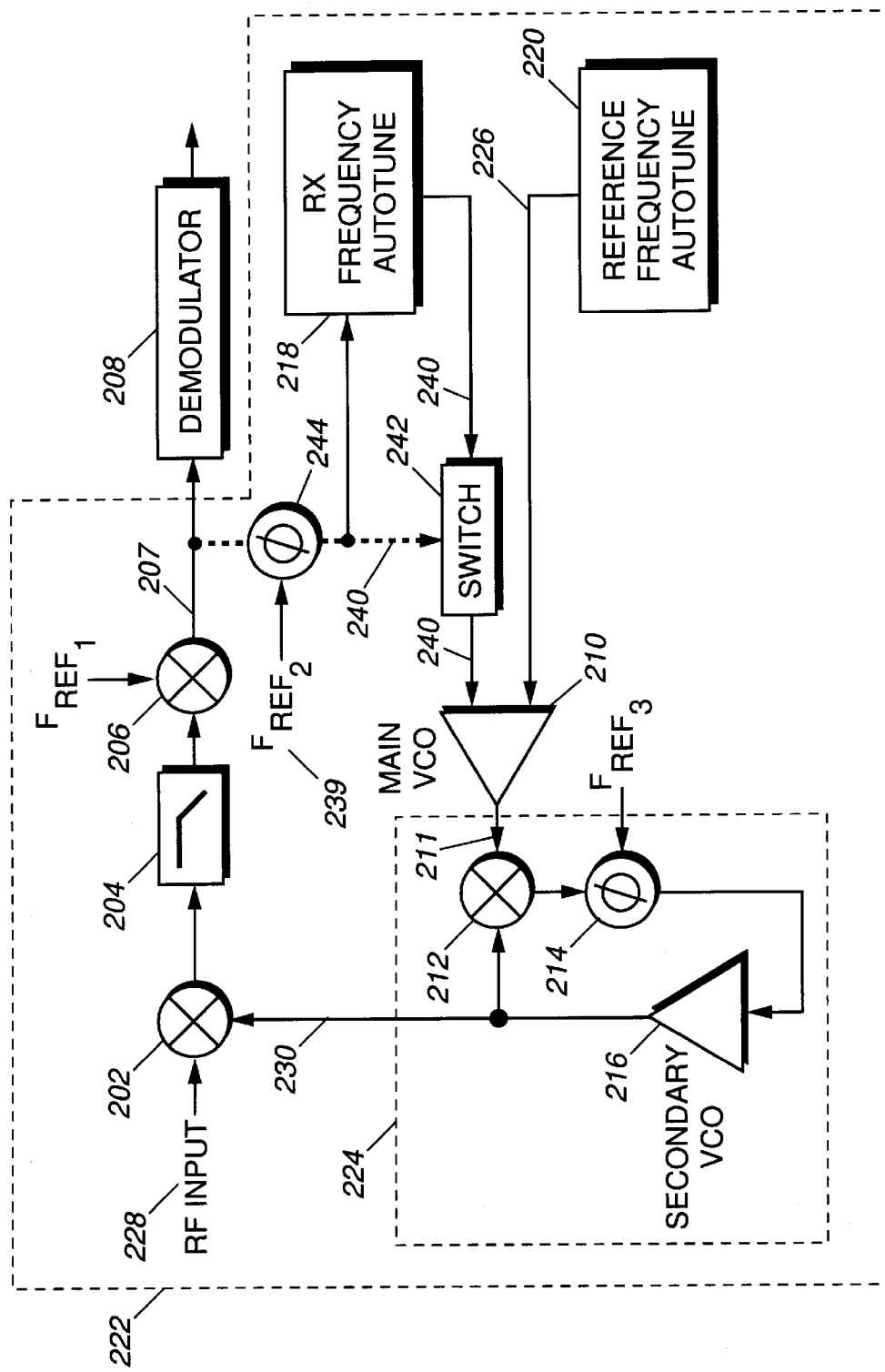
FIG. 2 is a block diagram of a receiver circuit in accordance with the present invention.

FIG. 2 is a block diagram of a receiver 200 formed in accordance with the present invention. Receiver 200 is preferably integrated and includes down mixer 202, filter 204, up mixer 206, demodulator 208, main VCO 210, mixer 212, phase detector 214, and secondary VCO 216. In accordance with the present invention, receiver 200 includes a reference frequency automatic tuning circuit 220 for coarse tuning the main VCO 210 and a receive frequency automatic tuning circuit 218 for fine tuning the main VCO. Receiver 200 is formed of a main loop 222 and secondary loop 224. The main loop 222 generally includes mixer 202, filter 204, mixer 206, main VCO 210, receive automatic tuning circuit 218, reference automatic tuning circuit 220, and main VCO 210. Secondary loop 224 is formed generally of secondary VCO 216, mixer 212, and phase detector 214.

The two automatic tuning circuits of the present invention 220, 218 are used to drive the main VCO 210 using first and second correction voltages 226, 240 respectively. The reference frequency automatic tuning circuit 220 preferably operates in the prior art manner previously described in which the error is calibrated out by taking the difference between the reference frequency ($F_{REF2}$) 239 and the VCO frequency. The reference frequency automatic tuning circuit 220 compensates for make tolerances, while, in accordance with the present invention, the receive frequency automatic tuning circuit 218 calibrates out the frequency error between the receiver 200 and the incoming signal 228. In operation, an incoming RF signal 228 is received and the receiver 200 enters a phase locked mode of operation. The first mixer 202 receives the incoming RF input signal 228 and a first LO input signal 230 and generates an IF output signal. The IF signal is filtered at filter 204 and injected into mixer 206 for mixing with a first reference frequency ($F_{REF1}$) and generating an output signal 207. The reference frequency automatic tuning circuit 220 generates the first correction voltage 226 with which to coarse tune the main VCO 210. The phase detector 244, switchably coupled to the main VCO 210 via switch 242, compares the output 207 of the second mixer 206 with a second reference frequency ($F_{REF2}$) 239 and generates the second correction voltage 240 with which to fine tune the VCO. In accordance, with the present invention, the phase detector applies the second correction voltage to tune the VCO 210 during a predetermined portion of the incoming signal 228 during phase locked mode. In accordance with the present invention, the receive frequency automatic tuning circuit 218 samples and stores this second correction voltage 240.

In accordance with the present invention, the receiver 200 is then switched to a non-phase locked mode of operation by switching out phase detector 244 via switch 242 thereby opening up the main loop 222. The stored fine tuning correction voltage 240 is then applied to the main VCO 210 by the receive frequency automatic tuning circuit 218 while the receiver 200 is operating in a non-phase locked mode. Non-phase locked operation and application of the fine tuning voltage 240 to the main VCO 210 is maintained during the remainder of the RF input signal 228. The reference frequency automatic tuning circuit 220 maintains application of the first correction voltage to the main VCO 210 throughout both phase locked operation and non-phase locked operation. The tuned VCO output 211 is used to drive the secondary loop 224 in the manner previously described.

The correction voltage 240 used to tune the main VCO 210 is preferably stored in a digital format in the receiver frequency automatic tuning circuit 218 or alternatively is stored in a separate controller (not shown). The automatic tuning circuits 218, 220 can be implemented using a variety of gate configurations, such as comparators, along with analog-to-digital (A/D) converters known in the art. The automatic tuning of receiver 200 can be described in terms of method steps for calibrating a LO frequency to an incoming RF signal in a radio. In accordance with the present invention, these steps include receiving a RF signal 228, operating in a phase locked mode of operation, and applying a correction voltage 240 to fine tune the VCO during the phase locked mode of operation. Then, by storing the correction voltage 240, entering a non-phase locked mode of operation, and applying the stored correction voltage to the VCO 210 for the duration of the RF signal 228, the LO signal 230 has effectively been calibrated to the incoming RF signal.

Again, the receiver 200 of the present invention operates in a non-phase locked mode when no RF signal is detected, operates in a phase locked mode for a predetermined time during the reception of an incoming RF signal, and returns back to a non-phase locked mode of operation for the remainder of the incoming RF signal. By operating in a non-phase locked mode the advantages of improved group delay characteristics, improved adjacent channel performance, and improved hum and noise are achieved. The main VCO 210 maintains an appropriate operating frequency during both phase locked and non-phase locked modes of operation through the use of the reference frequency automatic tuning circuit 220 and the receive frequency automatic tuning circuit 218 of the present invention.

Accordingly, there has been provided an apparatus and technique with which to automatically calibrate the VCO of a receiver. Because of the non-phase locked operation incorporated into the operation of receiver 200, all the modulation components go through demodulator 208 without the need for a second port or equalization path. This gives a reduction in circuitry, reduced die area, and less complexity. Improved group delay, particularly when the received data is modulated with two or four level FM, is another benefit achieved in non-phase locked operation. The problem of indecisive channel locking is also minimized since the loop is no longer operating in a phase locked mode. The interaction between the main loop and the secondary loop has been simplified by elimination one of the feedback systems, and as such the overall complexity of the receiver is reduced and reliability is improved.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A receiver, including:
    a first mixer for receiving an incoming RF input signal and a first LO input signal and generating an IF output signal;
    a filter for filtering the IF output signal into a filtered IF signal;
    a second mixer for mixing the filtered IF signal with a first reference frequency and generating an output;
    a VCO;
    a reference frequency automatic tuning circuit for generating a first correction voltage with which to coarse tune the VCO;
    a phase detector for comparing the output of the second mixer with a second reference frequency and generating a second correction voltage with which to fine tune the VCO for a predetermined portion of the incoming RF signal; and
    a receive frequency automatic tuning circuit for storing the second correction voltage and applying the second correction voltage to the VCO while the PLL operates in a non-phase locked mode of operation during the remainder of the RF input signal.

2. A receiver, comprising:
    a main loop operating in a non-phase locked mode when no RF signal is detected, operating in a phase locked mode for a predetermined time during the reception of incoming RF signal, and the main loop returning back to a non-phase locked mode of operation for the remainder of the incoming RF signal, the main loop including:
    a main loop VCO, the main loop VCO maintaining an appropriate operating frequency during both phase locked and non-phase locked modes of operation;

a reference frequency automatic tuning circuit for applying a first correction voltage to the main loop VCO;

a phase detector switchably coupled to the main loop VCO for applying a second correction voltage to the main loop VCO during phase lock operation; and a receive frequency automatic tuning circuit for storing the second correction voltage generated during phase locked operation and applying the second correction voltage to the main loop VCO during non-phase locked operation for the remainder of the incoming RF signal.

3. The receiver of claim 2, wherein the first correction voltage is applied to compensate for make tolerances of the main loop VCO.

4. The receiver of claim 2, A wherein the second correction voltage is applied for fine tuning the main loop VCO.

5. The receiver of claim 2, further comprising a secondary loop driven by the operating frequency of the main loop VCO.

6. A method of calibrating a local oscillator (LO) frequency to an incoming radio frequency (RF) signal in a receiver, comprising the steps of:

provided a main loop and a secondary loop, the main loop having a main VCO and the secondary loop having a secondary VCO;

detecting the incoming RF signal;

applying a correction voltage to the main VCO to tune the VCO to the incoming RF signal;

phase locking the RF signal for a predetermined time using the main loop and the secondary loop;

sampling the correction voltage applied to the main loop during phase locked operation;

storing the correction voltage;

entering a non-phase locked mode of operation; and applying the stored correction voltage to the main VCO for the duration of the incoming RF signal.

\* \* \* \* \*